United States Patent [19]

Bajor et al.

[11] Patent Number: 4,900,689
[45] Date of Patent: Feb. 13, 1990

[54] METHOD OF FABRICATION OF ISOLATED ISLANDS FOR COMPLEMENTARY BIPOLAR DEVICES

[75] Inventors: George Bajor, Melbourne; Hugh C. Nicolay, Melbourne Village, both of Fla.

[73] Assignee: Harris Corporation, Melbourne, Fla.

[21] Appl. No.: 281,546

[22] Filed: Dec. 8, 1988

[51] Int. Cl.⁴ .................. H01L 29/72; H01L 27/02
[52] U.S. Cl. .................................... 437/31; 437/33; 437/61; 357/34; 357/44
[58] Field of Search ............... 437/31, 32, 33, 909, 437/917, 90, 91, 92, 61, 62, 63; 357/34, 35, 23.4, 43.44, 47, 50; 148/DIG. 10, DIG. 11

[56] References Cited

U.S. PATENT DOCUMENTS

| | | | |
|---|---|---|---|
| 3,793,088 | 2/1974 | Eckton, Jr. | 437/31 |
| 4,719,185 | 1/1988 | Goth | 437/31 |

FOREIGN PATENT DOCUMENTS

| | | | |
|---|---|---|---|
| 0042144 | 3/1982 | Japan | 437/62 |
| 0168258 | 10/1983 | Japan | 437/90 |

Primary Examiner—Brian E. Hearn
Assistant Examiner—Tuan Nguyen
Attorney, Agent, or Firm—Barnes & Thornburg

[57] ABSTRACT

A process includes selectively forming laterally adjacent complementary doped epitaxial layers over low resistive buried regions of a horizontally isolated substrate. Self-aligned oxide mask are used for the epitaxial deposition. Lateral dielectric isolation trenches at the complementary doped epitaxial boundary complete the isolation of the islands. Base and emitter regions are formed in the epitaxial collector layers.

17 Claims, 4 Drawing Sheets

METHOD OF FABRICATION OF ISOLATED ISLANDS FOR COMPLEMENTARY BIPOLAR DEVICES

BACKGROUND AND SUMMARY OF THE INVENTION

The present invention relates generally to a method of fabricating isolated islands and more specifically to a method of fabricating isolated islands for complementary bipolar transistors.

Building bipolar transistors in integrated circuits having both NPN and PNP transistors has always been a difficult task. These generally include compromises on the different steps and impurity level, usually at the expense of the PNP transistor. In junction isolated circuits, either triple diffusion steps have to be performed, or lateral structures must be used to achieve the design goals. In dielectric isolation technology, the lateral bipolar transistor structure has significant limitations because of the surface effects and other technical limitations. In vertical structures in dielectric isolation technology, it is very difficult to provide a low resistance buried layer to the PNP transistor. The importance of the buried layer is that it decreases the collector resistance and is particularly critical for high frequency devices wherein all layer thicknesses have to be very small.

Thus it is an object of the present invention to provide a new method of fabricating isolated regions for complementary bipolar transistors having thin layers.

Another object of the present invention is to provide a method of fabricating isolated complementary bipolar transistors capable of high frequency operation.

A still further object of the present invention is to provide a dielectrically isolated complementary bipolar transistor having reduced resistance buried collector portions.

An even further object is to produce isolated complementary bipolar transistors with fewer process steps, including fewer photoresist masking steps and increased mask precision.

These and other objects of the invention are attained by forming first and second buried regions of opposite conductivity type in first and second regions of a horizontally isolated substrate. The horizontal isolation may be a dielectric or junction isolation. A first mask is formed over the second region and exposing the first region, and a third region of the first conductivity type is epitaxially deposited over the first region to the thickness of the mask and having a lower impurity concentration region than the buried first region. The first mask is removed and a second mask is formed by self-aligning technique over the third region and exposing the second region. A fourth region of the second conductivity region and a lower impurity concentration region than the second buried region is formed by epitaxial deposition having a thickness equal to the third region. A dielectric isolation region is then formed at adjacent lateral portions of the third and fourth region and the first and second buried regions. The third and fourth regions form collector regions and impurities are introduced to form appropriate base and emitter regions for the complementary bipolar transistors.

The number of steps of masking is substantially reduced and the precision mask alignment is increased by using a self-alignment technique. The first mask is formed of a first oxide inhibiting layer followed by a first mask layer. The second mask is formed by removing the first mask layer, oxidizing using the first mask inhibiting layer as a mask to form a second mask layer of oxide over the third region and exposing the second region. The first oxide inhibiting mask layer is then removed. As a further enhancement, forming the second mask includes applying a second oxide inhibiting mask layer before oxidizing to cover the exposed portion of the top and side edges of the third region. Using, for example, reactive ion etching, the second oxide inhibiting layer is removed to form horizontal surfaces which include the top of the third region leaving the second oxide inhibiting layer on the lateral edges of the third region.

The formation of the dielectric isolated region includes removing adjacent portions of the third and fourth region and first and second buried region to form a trench. The exposed surfaces are then covered with an insulative layer and the trench is filled with a polycrystalline material. The trench is formed down to the horizontal isolation. The horizontal isolation may be a horizontal dielectric layer or may be a PN junction.

Other objects, advantages and novel features of the present invention will become apparent from the following detailed description of the invention when considered in conjunction with the accompanying drawings.

DETAILED DESCRIPTION OF THE DRAWINGS

The present process will be described first with respect to totally dielectrically isolated regions and finally with respect to a mixture of lateral dielectric and horizontal junction isolation.

Figure 1:
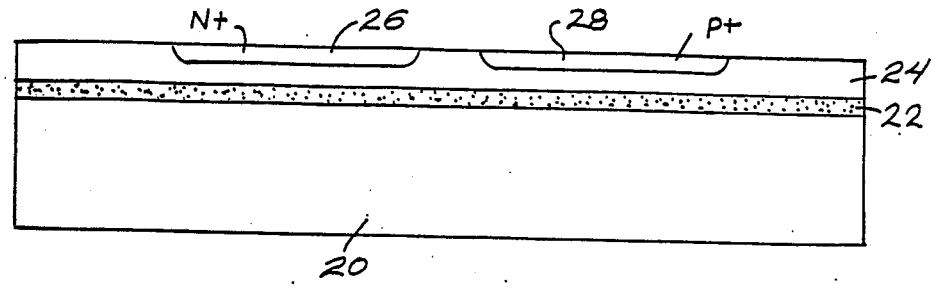
FIGS. 1-12 are cross-sectional views of a wafer at various stages of fabrication according to the principles of the present invention for a completely dielectrically isolated island.

A starting material or wafer handle 20 may be an oxidized silicon wafer having a thin single crystalline layer or substrate, for example silicon, 24 secured thereto by, for example, oxide bonding including a silicon dioxide layer 22 or other suitable technologies. The silicon layer 24 may have a thickness in the range of 1 to 5 microns, although the thickness tolerance is not critical since it does not form the defining portion of the bipolar transistors. The doping level also is not important, and may be assumed to be lightly doped N-type silicon. A silicon dioxide layer 22 forms the bottom or horizontal portion of the isolation system. Using appropriate masks, N+ impurities and P+ impurities are introduced to form N+ buried region 26 and P+ buried region 28. These may be formed by conventional masking techniques and include either deposition and diffusion or ion implantation. The resulting structure, as illustrated in FIG. 1, will form the low resistivity buried collector contact regions.

Figure 2:
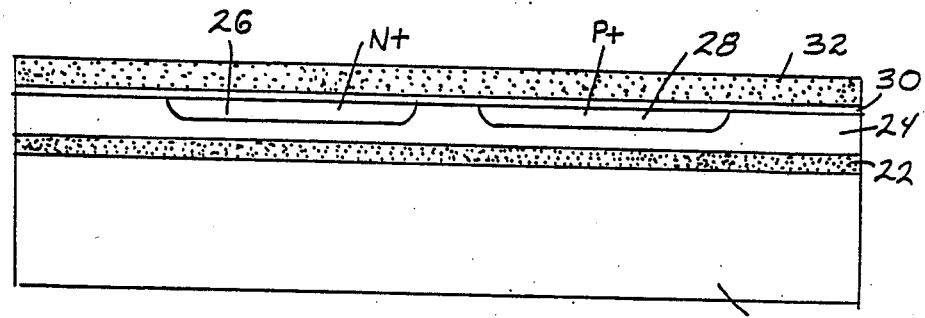

Next, an oxide inhibiting layer 30, for example a silicon nitride layer, is formed by low pressure chemical vapor deposition. It is generally preferable to provide a thin oxide layer to the surface of the substrate 24 prior to forming the silicon nitride layer 30. A masking layer 32 is then formed and may be, for example, an oxide formed by chemical vapor deposition of silox. The thickness of the masking layer 32 will define the thickness of the to be formed epitaxial layers which form the active regions of the bipolar transistors, namely generally the collectors. For ultra-high frequency transistors, the thickness of the masking layer 32 is in the range of 1.5 microns and may be anywhere from 1 to 4 microns. The resulting structure is illustrated in FIG. 2.

Figure 3:
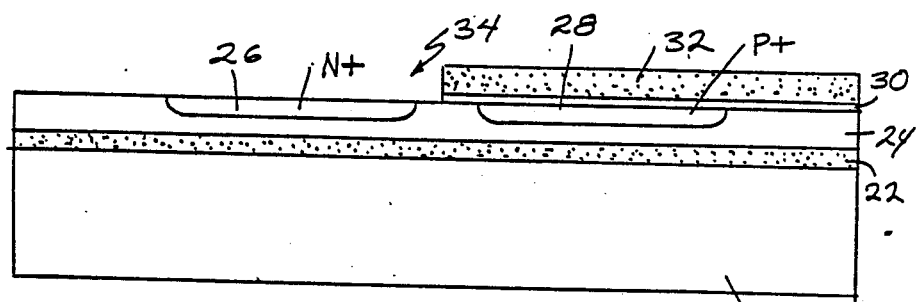

To form a first mask, selected portions of the mask layer 32 and the first oxide inhibited layer 30 must be removed. This can be done by standard photoresist and etching techniques. Since it is important that the mask have a vertical wall on the remaining mask layer 32 and oxide inhibiting layer 30, preferably reactive ion etching is used. The resulting structure is shown in FIG. 3 wherein an opening 34 is formed exposing the N+ buried layer 26 and a first region of the substrate 24.

Figure 4:
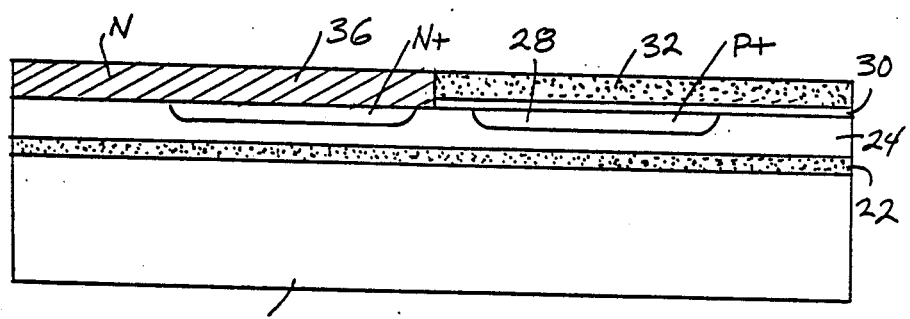

Epitaxial deposition is then performed which selectively forms a silicon layer 36 on the exposed portion of the substrate 24. The first epitaxial layer 36 is formed to the height of the first mask including oxide inhibiting layer 30 and the mask layer 32. As is well known for certain conditions, no grain formation occurs on the surface of the silicon dioxide layer 32 and good quality epitaxial film is deposited on the exposed silicon surface of substrate 24. The conditions which allow this to happen are low pressure and low temperature epitaxial deposition using, for example, trichlore or silane, as a gas source. A typical example of the pressure range and temperature range are 40 to 80 millitorr for the pressure and 750 to 950 degrees centigrade for the temperature. The resulting epitaxial layer 36 is doped with, for example, N− impurity concentration. The resulting structure is shown in FIG. 4.

Figure 5:
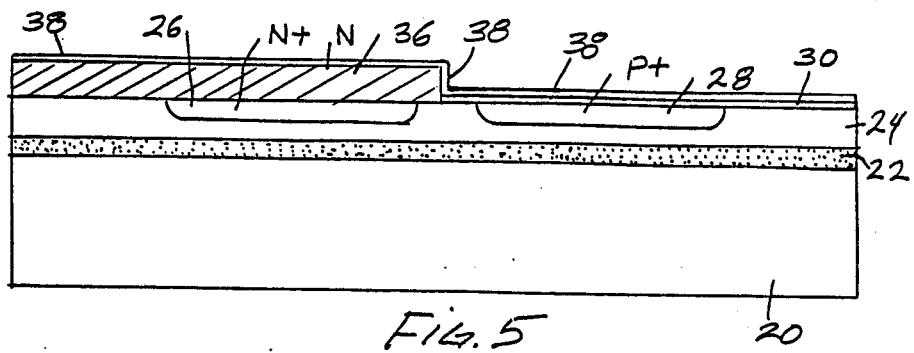

The process then proceeds with the formation of the second mask. The first masking layer 32 is removed by, for example, wet chemistry. A second oxide inhibiting layer 38 is then formed. As previously, this is preceded by a thin oxide growth which is not illustrated. The second oxide inhibiting layer 38 is formed over the exposed portions of the N epitaxial layer 36, its horizontal and side edges, as well as on the first oxide layer 30. The second oxide inhibiting layer 38 is thinner than the first oxide inhibiting layer 30 and is generally about half the thickness. The resulting structure is illustrated in FIG. 5.

Figure 6:
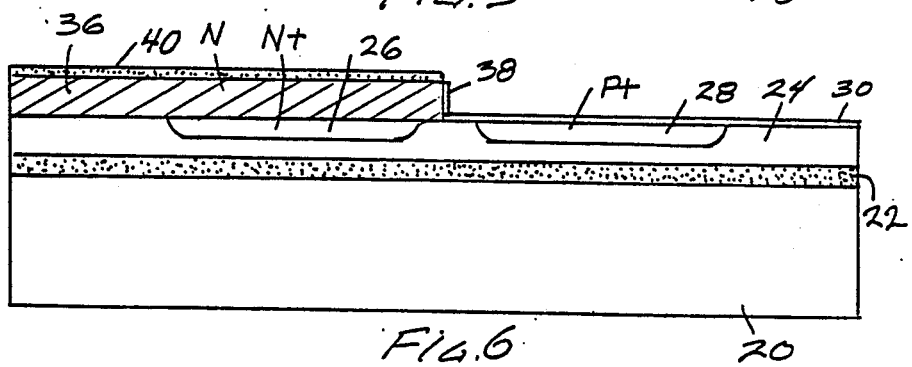

The second oxide inhibiting layer, which may also be silicon nitrate, is selectively removed from the horizontal surfaces by reactive ion etching. This removes the layer 38 from the top of the epitaxial layer 36 as well as over the first oxide inhibitive layer 30. It leaves the layer 38 on the lateral edges of the epitaxial layer 36. The wafer is then exposed to an oxidizing atmosphere to form an oxide layer 40 as a second mask only over the epitaxial region 36. The resulting structure is illustrated in FIG. 6.

Figure 7:
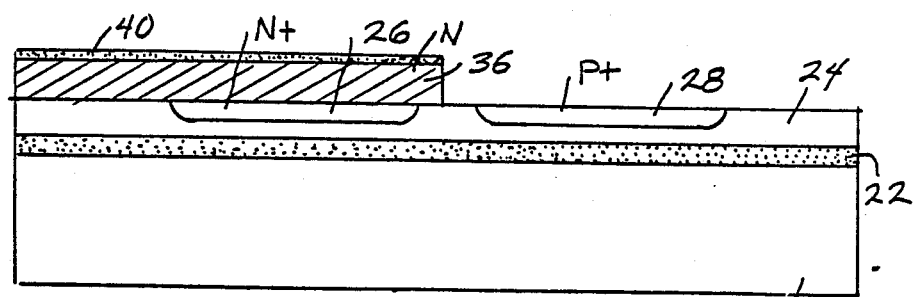

Using wet chemistry, the oxide inhibiting layer 30 and 38 are selectively removed. This will produce a step where the epitaxial layer 36 is covered with the silicon dioxide mask 40 while the silicon surface is bare above the P+ buried layer 28. This is illustrated specifically in FIG. 7. It should be noted that there was no need for a second photoresist step. Thus, the double oxide inhibiting layer results in a self-aligned technology.

Figure 8:
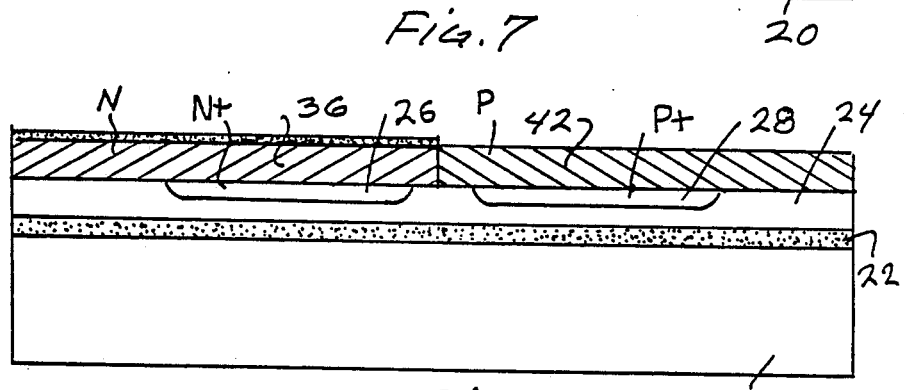

A second selective epitaxial silicon film is grown on the exposed silicon region resulting in P-type impurity region over the buried region 28. The resulting structure is illustrated in FIG. 8. The epitaxial layer 42 is formed to the height of the first epitaxial layer 36.

By using the selective epitaxial grown technique twice, it is possible to deposit on one wafer N-type and P-type epitaxial layers on different places self-aligned and next to each other. Although the crystal quality at the interface of the N and P epitaxial layers will be degraded because of simultaneous growth on the perpendicular surfaces, this poor quality film is not expected to extend laterally further than the thickness of the epitaxial layer itself. Thus, for the example described, this region is approximately 1.5 microns.

As an alternative to the double selective expitaxial growth process of FIGS. 2–6, the first epitaxial layer 36 may be grown non-selectively our the over the total substrate 24. A layer of oxide equivalent to layer 40 of FIG. 6 may then be formed on the oxide layer and the oxide layer and first epitaxial layer 36 are selectively removed by etching to produce the structure illustrated in FIG. 7. The second epitaxial layer is then grown selectively and self-aligned as in the previous process.

Figure 9:
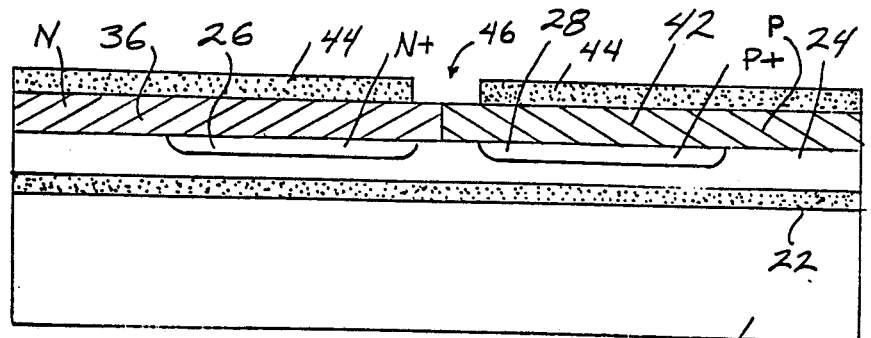

The lateral isolation is formed as follows. The masking layer 40 is removed by a well-known technique from the surface of the N epitaxial layer 26. A new mask layer 44 is formed by, for example, oxidation. This may include chemical vapor deposition, as well as thermal oxidation. The mask layer 44 is then patterned by, for example, photoresist technique and etching, to provide an opening 46 exposing the adjacent regions of epitaxial layers 26 and 32. The resulting structure is illustrated in FIG. 9.

Figure 10:
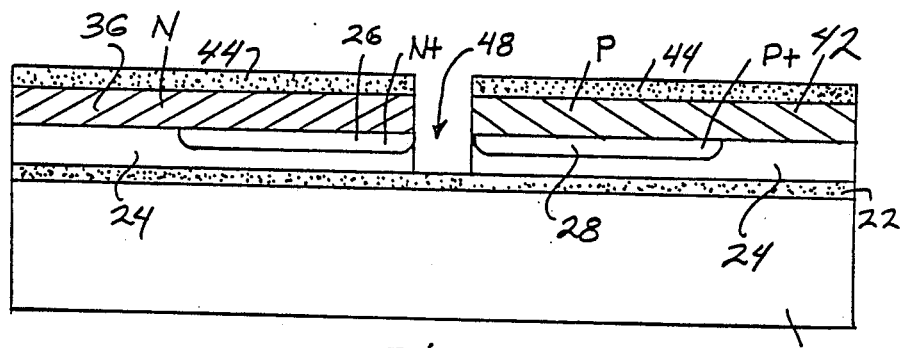

A deep trench 48 is etched through the epitaxial layers 26 and 32 and the base region 24 down to the horizontal dielectric layer 22, as illustrated in FIG. 10. This may be performed by reactive ion etching. The amount removed will generally encompass the 1.5 micron region having the poor grain boundary.

Figure 11:
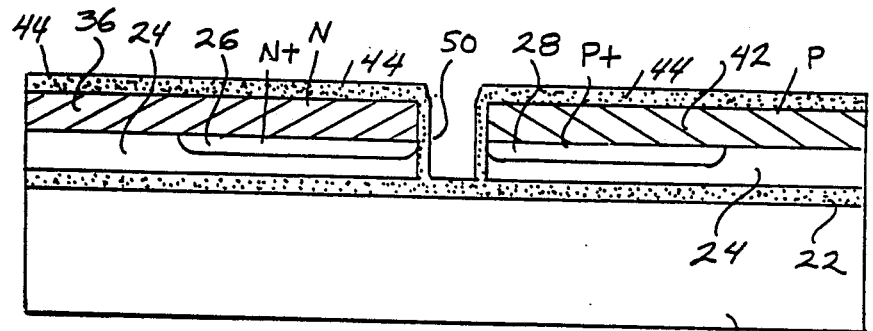
Figure 12:
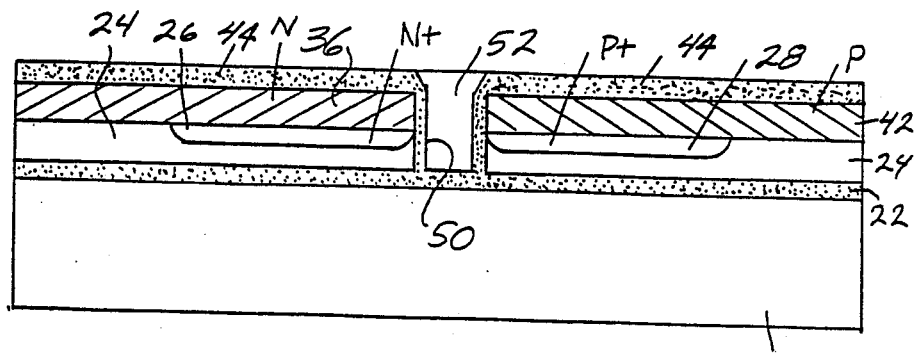

The walls of trench 48 are then oxidized to form a silicon dioxide layer 50 on the walls of the trench. This may be performed by thermal oxidation or a combination of thermal oxidation and chemical vapor deposition. The resulting structure is illustrated in FIG. 11. The trenches then can be refilled with polycrystalline silicon and planarized using well-known techniques. The resulting structure containing N+ and P+ buried regions that are covered by N-type and P-type epitaxial layers respectively are dielectrically isolated and planarized as illustrated in FIG. 12.

Figure 13:
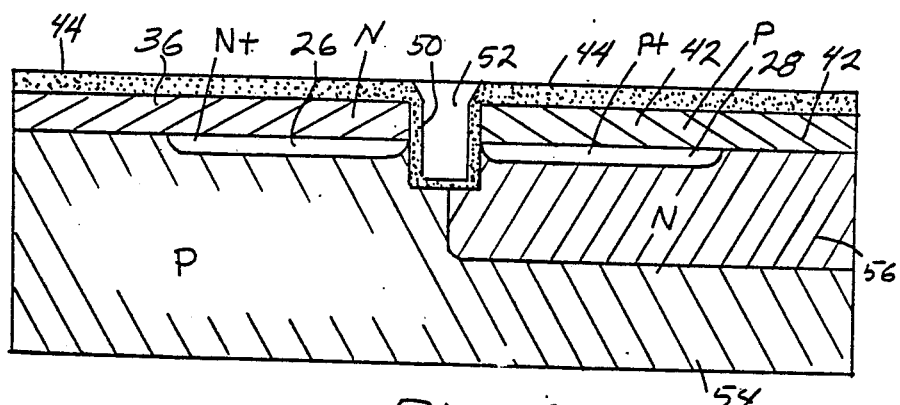
FIG. 13 is a cross-sectional view of the resulting product of the present invention applied to horizontal junction isolated regions with lateral dielectrical isolation.

The process as described may also be used with a junction isolation along the bottom of the regions. As illustrated in FIG. 13, the original substrate 54 may be a P-type substrate having an N pocket 56 formed therein. The N+ buried region 26 is then formed in the substrate 54 and the P+ buried region is formed in the N pocket 56. The process is then the same as described in FIGS. 2–9. In FIG. 10, the etching is performed down to the horizontal isolation which in this case is the PN junction between the substrate 54 and the N pocket 56. The process of FIG. 11 and 12 are then continued to produce the lateral dielectric isolation in combination with horizontal junction isolation.

Figure 14:
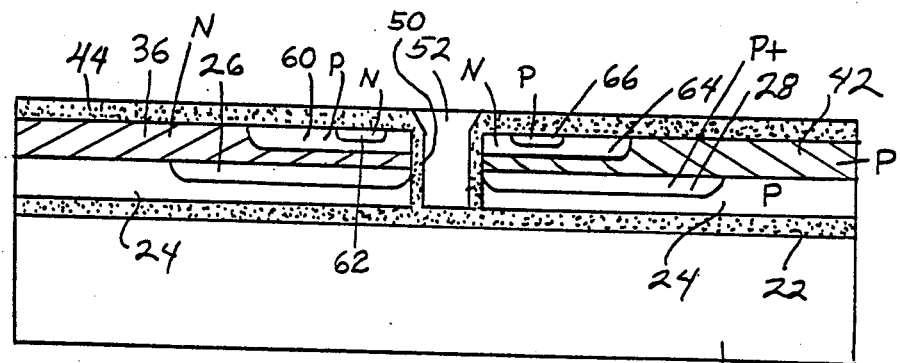
FIG. 14 is a cross-sectional view of complementary bipolar transistors in dielectrically isolated regions according to the principles of the present application.

In either case, bipolar transistors are then formed in the epitaxial region 36 and 42. As illustrated in FIG. 14, P-type impurities are introduced to form a base region 60 in N collector region 36. N-type impurities are introduced into base regions 60 to form an N-type emitter region 62. This produces an NPN transistor. N-type impurities are introduced to form a base region 64 in the P epitaxial collector region 42. P-type impurities are introduced to form a P-type emitter region 66 in the base region 64. This produces a PNP transistor in the epitaxial layer 42.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A process for fabricating complementary isolated islands on a substrate having at least first and second semiconductor regions isolated by horizontal isolation comprising:
   forming a first buried region of a first conductivity type and impurity concentration in said first region of said substrate;
   forming a second buried region of a second conductivity type and impurity concentration in said second region of said substrate;
   epitaxially forming a third region of said first conductivity type having a smaller impurity concentration than said first buried region and having a first thickness at least on said first region;
   forming a first mask over said third region and exposing said second region;
   epitaxially forming a fourth region of said second conductivity type, having a smaller impurity concentration than said second buried region and having a thickness equal to said third region; and
   forming a dielectric isolation region at adjacent lateral portions of said third and fourth regions and said first and second buried regions.

2. A process according to claim 1, wherein epitaxially forming said first region includes forming a second mask over said second region and exposing said first region, epitaxially forming said third region on said first region to a thickness of said second mask, and removing said second mask before forming said first mask.

3. A process according to claim 2, wherein forming said second mask includes forming a second oxide inhibiting layer and a second mask layer on said second oxide inhibiting layer, and removing said second mask includes removing said second mask layer.

4. A process according to claim 3, wherein forming said first mask includes oxidizing using said second oxide inhibiting layer as a mask to form a first mask layer of oxide over said third region and exposing said second region, and removing said second oxide inhibiting layer.

5. A process according to claim 4, wherein forming said first mask further includes before oxidizing, forming a first oxide inhibiting layer and removing said first oxide inhibiting layer from over a top surface of said third region, leaving said first oxide inhibiting layer over lateral edges of said third region and second oxide inhibiting layer over said second region.

6. A process according to claim 5, wherein said first and second oxide inhibiting layers are formed of nitride and said removal of portions of said first oxide inhibiting layer is by reactive ion etching.

7. A process according to claim 5, wherein said first and second oxide inhibiting layers are formed by low pressure chemical vapor deposition.

8. A process according to claim 3, wherein forming said second mask includes removing portions of said second oxide inhibiting layer and said second mask layer by reactive ion etching.

9. A process according to claim 1, wherein said epitaxial forming said third and fourth regions are performed at low pressure and low temperature.

10. A process according to claim 1, wherein forming said dielectric region includes removing adjacent lateral portions of said third and fourth layers to form a trench down to said horizontal isolation, and covering exposed areas of said trench with a layer of insulation.

11. A process according to claim 10, wherein forming said dielectric isolation further includes filling said trench with polycrystalline semiconductor material.

12. A process according to claim 10, wherein said substrate is a semiconductor layer on a layer of insulator forming said horizontal isolation.

13. A process according to claim 10, wherein said substrate is a semiconductor substrate of one conductivity type and said horizontal isolation is a doped region of another conductivity type in semiconductor substrate, said first buried region and third region being formed in and on one of said semiconductor substrates or said doped region and said second buried region and fourth region being formed in and on the other.

14. A process according to claim 1, wherein said third and fourth regions are formed to have a thickness in the range of 1 to 4 microns.

15. A process according to claim 1, wherein epitaxially forming said third region includes forming said third region on said first and second regions and removing portions of said third region over said second region.

16. A process according to claim 15, wherein removing portions of said third region includes forming said first mask over said third region exposing portions of said third region over said second region and etching said exposed third region.

17. A process according to claim 1 including:
   forming a first bipolar transistor in said third region by introducing a second conductivity type impurity to form a base region and first conductivity type impurities to form an emitter region; and
   forming a second transistor complementary to said first bipolar transistor in said fourth region by introducing first conductivity type impurities to form a base region and second conductivity type impurities to form an emitter region.

* * * * *